(12) United States Patent
Lee et al.

(10) Patent No.: US 9,374,921 B2
(45) Date of Patent: Jun. 21, 2016

(54) DISPLAY APPARATUS

(75) Inventors: Chul Lee, Seoul (KR); Byungkil Lim, Seoul (KR); Myungwhoon Lee, Seoul (KR); Jonghyun Byeon, Seoul (KR); Jaeho Kim, Seoul (KR); Jeongrok Lee, Seoul (KR); Hyunbyung Cha, Seoul (KR); Yongho Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 57 days.

(21) Appl. No.: 14/372,983

(22) PCT Filed: Jul. 16, 2012

(86) PCT No.: PCT/KR2012/005640
§ 371 (c)(1),
(2), (4) Date: Jul. 17, 2014

(87) PCT Pub. No.: WO2013/141447
PCT Pub. Date: Sep. 26, 2013

(65) Prior Publication Data
US 2014/0376203 A1    Dec. 25, 2014

(30) Foreign Application Priority Data

Mar. 23, 2012 (KR) .................. 10-2012-0030033

(51) Int. Cl.
| | |
|---|---|
| *H05K 5/02* | (2006.01) |
| *F16M 11/08* | (2006.01) |
| *F16M 11/22* | (2006.01) |
| *H01F 7/02* | (2006.01) |
| *H05K 5/00* | (2006.01) |

(Continued)

(52) U.S. Cl.
CPC ............ *H05K 5/0234* (2013.01); *F16M 11/08* (2013.01); *F16M 11/22* (2013.01); *F16M 11/42* (2013.01); *H01F 7/0247* (2013.01); *H05K 5/0017* (2013.01); *F16M 2200/08* (2013.01); *H04N 5/64* (2013.01)

(58) Field of Classification Search
CPC combination set(s) only.
See application file for complete search history.

(56) References Cited

U.S. PATENT DOCUMENTS

| | | | |
|---|---|---|---|
| 4,483,503 A * | 11/1984 | Gahan | F16M 11/14 248/181.1 |
| 5,564,669 A | 10/1996 | Wu | |
| 5,685,514 A * | 11/1997 | Carnahan | A47B 11/00 248/349.1 |

(Continued)

FOREIGN PATENT DOCUMENTS

| | | |
|---|---|---|
| CN | 1256587 | 6/2000 |
| CN | 1917091 | 2/2007 |

(Continued)

OTHER PUBLICATIONS

European Search Report date Oct. 26, 2015.

(Continued)

*Primary Examiner* — Lisa Lea Edmonds
(74) *Attorney, Agent, or Firm* — Ked & Associates, LLP (57) ABSTRACT

A display apparatus according to the embodiment of the present invention includes a display body outputting an image signal; a stand supporting the display body and disposed on an installing surface; and a swivel member disposed in a bottom part of the stand and rotating the stand at a certain angle in a status where the stand is disposed on the installing surface, wherein the swivel member, includes a plurality of rotatable rolling members mounted in the bottom part of the stand, and the plurality of rolling members have the same revolution center.

16 Claims, 5 Drawing Sheets

(51) Int. Cl.
*F16M 11/42* (2006.01)
*H04N 5/64* (2006.01)

(56) References Cited

U.S. PATENT DOCUMENTS

| | | | | |
|---|---|---|---|---|
| 6,179,264 | B1* | 1/2001 | Moy | F16M 11/42 188/1.12 |
| 6,354,550 | B2* | 3/2002 | Jeong | F16M 11/08 248/299.1 |
| 6,801,426 | B2* | 10/2004 | Ichimura | F16M 11/08 248/349.1 |
| 7,392,965 | B2* | 7/2008 | Jung | F16M 11/12 248/125.2 |
| 7,503,532 | B2* | 3/2009 | Sim | F16M 11/00 248/188.1 |
| 7,748,680 | B2* | 7/2010 | Choi | F16M 11/02 16/367 |
| 7,750,590 | B2* | 7/2010 | Takaji | F16M 11/08 318/445 |
| 2001/0011696 | A1 | 8/2001 | Jeong | |
| 2002/0126110 | A1* | 9/2002 | Bowron | F16C 11/10 345/204 |
| 2006/0144186 | A1 | 7/2006 | Chih et al. | 74/543 |
| 2008/0158446 | A1 | 7/2008 | Yan | |
| 2008/0303845 | A1 | 12/2008 | McRight et al. | 345/649 |
| 2009/0045311 | A1* | 2/2009 | Seyedin | F16C 19/10 248/349.1 |
| 2009/0052885 | A1 | 2/2009 | Cramer | |
| 2010/0006175 | A1 | 1/2010 | Shinagawa et al. | |
| 2010/0157513 | A1 | 6/2010 | Guo | |
| 2010/0188804 | A1* | 7/2010 | Jang | F16M 11/10 361/679.01 |
| 2012/0106093 | A1* | 5/2012 | Takao | F16M 11/08 361/728 |
| 2012/0273630 | A1* | 11/2012 | Gillespie-Brown | F16M 11/041 248/122.1 |

FOREIGN PATENT DOCUMENTS

| | | |
|---|---|---|
| CN | 101211672 | 7/2008 |
| CN | 201859362 | 6/2011 |
| GB | 2 443 159 | 4/2008 |
| KR | 10-2007-0116348 A | 12/2007 |

OTHER PUBLICATIONS

Chinese Office Action dated Oct. 29, 2015 (English Translation).

* cited by examiner

DISPLAY APPARATUS

TECHNICAL FIELD

The embodiment of the present invention relates to a display apparatus.

BACKGROUND ART

A display apparatus is an apparatus for outputting an image signal input from the outside on the screen. The display apparatus includes all devices displaying an image input from the outside such as a monitor displaying image received from a computer, and a TV displaying the image and sound transmitted from a broadcasting station.

The exist display apparatus mainly uses a Braun tube way, that is, a CRT way, the display apparatus using the CRT way is a box type having considerable bulk, and therefore, the apparatus has been disposed in an disposing face such as a desk by the media of a separate stand.

However, as a technology develops, the display apparatus is switched into a flat display apparatus such a LCD and a PDP out of the CRT way. Therefore, a thickness thereof is significantly reduced, thereby to significantly reduce the entire weight as well.

The flat display apparatus may be disposed by a wall-hanging way or a stand way. When the flat display apparatus is disposed by the wall-hanging way, after fixing a bracket for installation to a wall face, the flat display apparatus is mounted in the bracket for installation.

When the flat display apparatus is disposed by the stand way, the display body may be supported by the stand. The existing stand mounted in the display body includes a neck portion and a base portion. A top end of the neck portion is mounted in the bottom and back of the display body and supports load of the display body. Further, the base portion is mounted in a bottom end of the neck portion, and disperses the load of the display body on an installing surface, thereby to fix the display body having a thin thickness to be elected for the installing surface. One neck portion is generally disposed in the bottom center of the display body.

It is advantageous that the flat display apparatus performs a rotation movement due to the thin thickness and light weight. The recent display apparatus using above advantage includes a swivel function capable of viewing at an optimum viewing angle irrespective of the user's position.

The existing swivel structure includes a slip member between the display body and the neck portion. Since the existing swivel structure needs a lot of elements, there are disadvantages in that the structure thereof is complex, the weight of a product is increased, and it is necessary to need much time and effort on assembling it.

Further, the swivel structure is disposed in the back of the display body, and therefore, there are disadvantages in that the product is not thin, and it is impossible to balance the display body, due to a protrusion from the back of the display body. There is a disadvantage in that the bulk of the neck portion may be increased due to the structure for balancing the display body.

In recent, a design of the stand is switched into a line type for an elegant appearance of the product. The neck portion and base portion are omitted, and the stand of the line type supports the display body. The stand of the line type is combined at at least two points in the back or bottom of the display body, thereby to stably support the display body. Therefore, it is possible to implement the design of the display apparatus swiftly and tactfully.

However, when the display apparatus is composed of the stand of the line type, there is no enough space for the stand of the line type, and therefore, it is difficult to apply the swivel structure. Further, the top end of the stand of the line type is combined at at least two points of the display apparatus, and therefore, it is difficult to apply the existing swivel structure. The swivel structure of the display apparatus is recognized as an important factor for the convenience of the user and for affecting prices such that the competitiveness of the display apparatus not having the swivel structure may be damaged.

DISCLOSURE OF INVENTION

Technical Problem

An advantage of some aspects of the invention is that it provides a display apparatus capable of giving a swivel function to the display apparatus having a stand of a line type and controlling a swivel rotation at the maximum rotation angle.

Solution to Problem

According to an aspect of the invention, there is provided a display apparatus including a display body outputting an image signal; a stand supporting the display body and disposed on an installing surface; and a swivel member disposed in a bottom part of the stand and rotating the stand at a certain angle in a status where the stand is disposed on the installing surface, wherein the swivel member, includes a plurality of rotatable rolling members mounted in the bottom part of the stand, and the plurality of rolling members have the same revolution center.

Advantageous Effects of Invention

According to an embodiment of the present invention, the display apparatus may improve a sense of beauty for an appearance of a stand, may apply the swivel function to the stand of the line type as well, and may control the maximum angle for the swivel rotation.

MODE FOR THE INVENTION

Hereinafter, an idea of the present invention will be described in detail by concrete embodiments. However, the idea of the present invention is not limited to the embodiment to be suggested.

Figure 1:
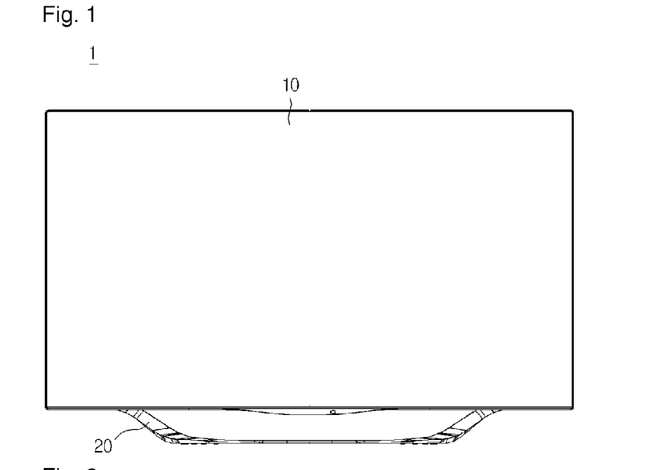
FIG. 1 is a front view showing a display apparatus according to a first embodiment of the present invention.
Figure 2:
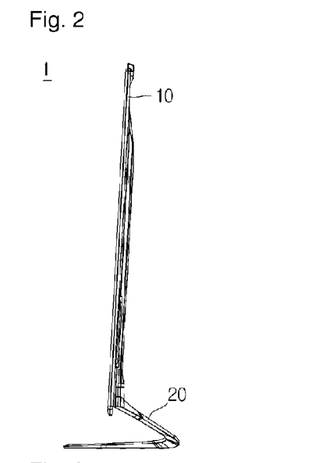
FIG. 2 is a side view showing the display apparatus according to the first embodiment of the present invention.

FIG. 1 is a front view showing a display apparatus according to an embodiment of the present invention, and FIG. 2 is a side view showing the display apparatus according to an embodiment of the present invention.

Referring to FIGS. 1 and 2, the display apparatus 1 according to an embodiment of the present invention includes a display body 10 and a stand 20. The stand 20 may be fixed to the display body 10.

The display body 10 includes a display module for implementing image. The display body 10 includes a front cover having a display region and a non-display region, a display module arranged in the rear of the front cover, a printed circuit board for controlling image, sound and communication etc. of the display module, and a back cover for covering the back of the display module.

In the display apparatus, the display region and non-display region of the front cover may be distinguished in various ways. As an embodiment, the display region may be formed of a plate formed of transparent resin or glass, and the non-display region may be formed by printing translucent or opaque ink or film to any one edge portion of the plate.

As different way, as much applied to the existing display apparatus, a center of the front cover may be a frame shape formed with an opening, the opening becomes the display region, and the frame section may become the non-display region.

A space between the front cover and the back cover may be disposed with the above-described display module, a printed circuit board, and a speaker module etc. together.

The display module may include all of EL (Electro Luminescence), LED (Light Emitting Diode), PDP (Plasma Display Panel), LCD (Liquid Crystal Display) and various kind of the display module.

The stand 20 is made up of a line type having a certain thickness and area, and supports the display body 10. The end of the stand 20 may be coupled with the back or bottom of the display body 10. The stand 20 has enough rigidity to support load of the display body 10, and may be formed by the material such as transparent resin for an elegant appearance.

Figure 3:
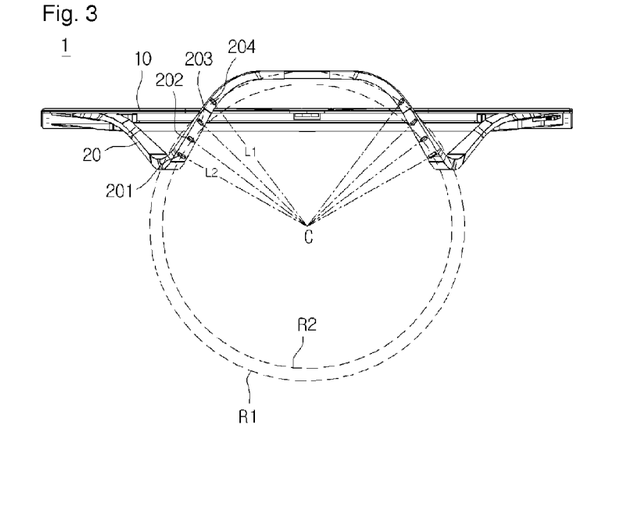
FIG. 3 is a bottom view showing the display apparatus according to the first embodiment of the present invention.
Figure 4:
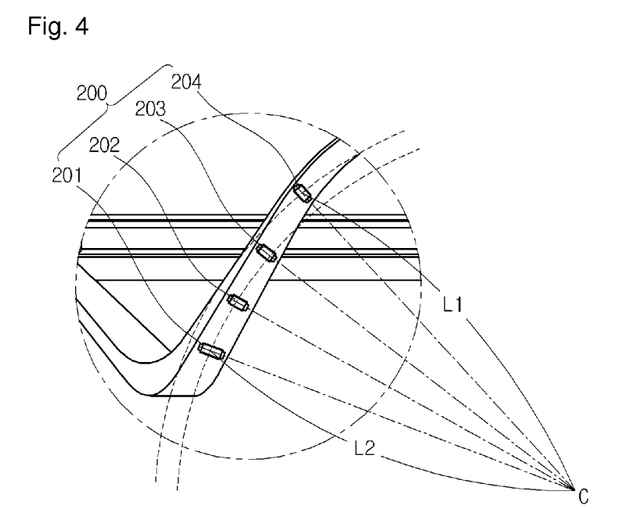
FIG. 4 is a view showing a part of a bottom for a stand of the display apparatus shown in FIG. 3.

FIG. 3 is a bottom view showing the display apparatus according to an embodiment of the present invention, and FIG. 4 is a view showing a part of a bottom for a stand of the display apparatus shown in FIG. 3.

Referring to FIGS. 3 and 4, in an embodiment of the present invention, the bottom of the stand 20 for a display apparatus 1 may be disposed with a plurality of rolling members 200. The display apparatus 1 may be rotated from side to side (swiveled) by the plurality of rolling members 200. Hereinafter, it is described that the display apparatus 1 performs a swivel function by the plurality of rolling members 200.

The plurality of rolling members 200 are disposed in the bottom of the stand 20, and may be rotated around the same revolution center C. In other words, the display body is rotated from side to side around the a neck section in the existing display apparatus fixing the stand to the installing surface, while the display body 10 of the present invention is integrally formed with the stand 20 and the stand 20 itself is rotated around the revolution center C. Therefore, on swiveling the display body 10 to the left or right, the plurality of rolling members 200 are rotated on the basis of a center axis and simultaneously revolved centered on the revolution center C.

The plurality of rolling members 200 may be suitably positioned in the bottom of the stand 20 corresponding to points having a thickness capable of disposing the rolling members 200. However, a rotational axis of the plurality of rolling members 200 should be placed on a straight line passing through the revolution center C. That is, the rotation axes of each of the rolling members 200 should be always crossed at right angles to tangent lines passing through revolution trajectories of the rolling members.

For example, the plurality of rolling members 200 includes a first rolling member 201, a second rolling member 202, a third rolling member 203, and a fourth rolling member 204, and the first rolling member 201, the second rolling member 202, the third rolling member 203 and the fourth rolling member 204 are spaced at a certain distance apart from each other to rotate around the revolution center C. The first rolling member 201, the second rolling member 202, the third rolling member 203 and the fourth rolling member 204 may be rotated around the revolution center C, but a straight line movement of the display apparatus 1 is limited in the front and rear direction or from side to side.

The existing member may be used as the rolling members 200, and therefore, the description about the kind and disposition of the rolling member is omitted. Further, the description about the number and installation position of the rolling members 200 is not limited to the above description.

The plurality of rolling members 200 are revolved around the revolution center C, and therefore, the display apparatus 1 is rotated around the revolution center C. The plurality of rolling members 200 need not to position on the same circumference. That is, the first rolling member 201, the second rolling member 202, the third rolling member 203 and the fourth rolling member 204 are revolved around the same revolution center C, but radiuses from the revolution center C to each of the rolling members may be different from each other.

For example, when a radius from the revolution center C to the first rolling member 201 is L2 and the radius from the revolution center C to the fourth rolling member 204 is L1, a circle drawn by rotating the first rolling member 201 is L2 and a circle drawn by rotating the fourth rolling member 204 is L1. Although the L2 and L1 share the center of the circle, the L1 may not be coincided with the L2. Although the L1 is not coincided with the L2, since the first rolling member 201 and the fourth rolling member 204 share the revolution center C, it is possible to rotate them in the same direction. Therefore, the display apparatus 1 may be swiveled around the revolution center C.

On the other hand, the plurality of rolling members 200 may include a spherical ball not having a directivity of rotation. That is, the spherical ball may be rotated even in any direction. At this time, at least one of the plurality of rolling members 200 should be used with the rolling member having a determined revolution center. That is, at least one of the plurality of rolling members 200 should be provided in the form of revolving around the revolution center C while rotating. As examples thereof, a caster, a pin bearing or a needle bearing of a roller type having a predetermined width are suggested. The ball 210 not having the directivity of rotation is disposed in the bottom of the stand 20, thereby to more softly swivel the display apparatus 1. Although the ball 210 has not the directivity of rotation, the ball 210 may revolve around the same revolution center C as the rolling members 200 by at least one rolling members 200 having the directivity of rotation.

The rolling member 200 may be disposed with a mechanism for limiting a rotation amount of the display apparatus 1. For example, the side of the rolling members 200 may be included with a stopper to be protruded. In detail, at least one side of the plurality of rolling members 200 is disposed with the stopper (not shown) to be protruded in a predetermined length, and the bottom of the stand 20 may be formed with an interference section to be interfered with the stopper (not shown). In detail, the interference section may be formed in an inner periphery of a groove accommodated with the rolling members 200. The interference section includes a projection or a jaw. Therefore, when the rolling members rotate at a predetermined angle, the stopper (not shown) is interfered by the projection to limit the rotation. Therefore, a rotation angle of the display apparatus 1 may be limited. As different example, at least one side of the rolling members 200 is formed with a fixing groove, and the inner periphery of the groove 221 (refer to FIG. 8) accommodated with the rolling members 200 may be mounted with the stopper. The stopper may include a ball bearing, and a spring pushing the ball bearing. Therefore, when the rolling members 200 rotates, the ball bearing is pushed into the groove for accommodating the ball bearing by the side of the rolling members 200. At this time, the spring pushing the ball bearing is maintained in a compressed state. Further, when the rolling members 200 rotate and the fixing groove reaches the ball bearing, the ball bearing is fixed to the fixing groove by force of restoration of the spring to limit the rotation of the rolling members 200.

On the other hand, the display apparatus 1 may be disposed with a structure for controlling the rotation angle (rotation amount) of the rolling members 200 by outside power. Further, the rotation of the rolling members 200 are controlled by a motor. Further, an user uses a remote controller to drive the motor, thereby to swivel the display apparatus 1. Therefore, the user uses the remote controller to suitably rotate the rolling members 200, thereby to rotate the display apparatus 1 in a desirable direction.

The rolling members 200 may be coated with the material having high frictional factor such as rubber, silicon etc. When the rolling members 200 may be coated with the material having high frictional factor, the adherent force between the bottom to be contacted with the rolling members 200 and the rolling members 200 may be increased. Since the rolling members 200 functions as a body of rotation and simultaneously performs a function for supporting the display apparatus 1, the display apparatus 1 may be stably disposed in case of performing the coating.

Figure 5:
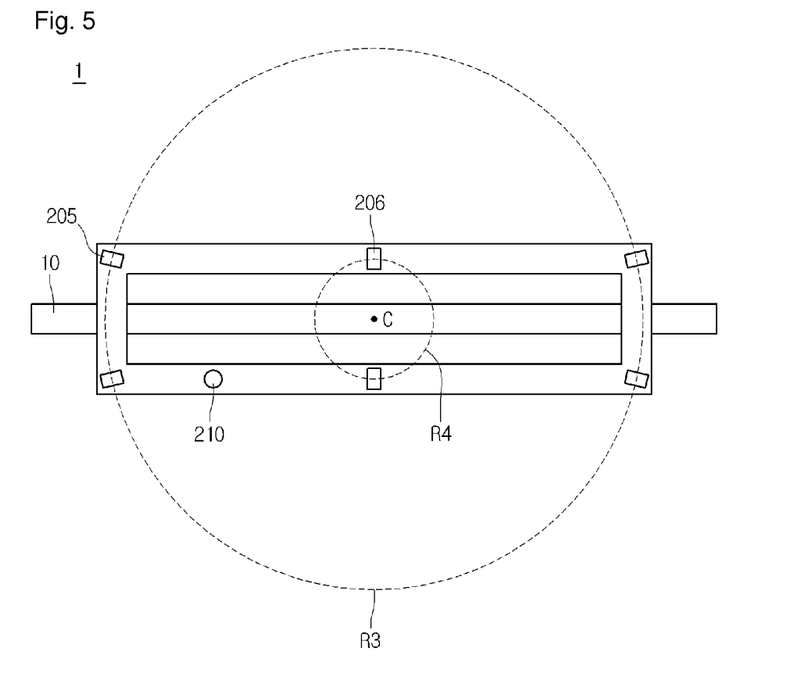
FIG. 5 is a view showing the bottom of the display apparatus according to a second embodiment of the present invention.

FIG. 5 is a view showing the bottom of the display apparatus according to a second embodiment of the present invention.

In FIG. 5, the bottom part of the stand 20 for the display apparatus 1 may be disposed as the line type having a quadrangle shape. The stand 20 may be fixed to the bottom of the display apparatus 1.

The corners of the stand 20 may be disposed with a plurality of rolling members 205 having the same revolution center C. The rolling members 205 are rotated around the revolution center C, and a circle drawn to be rotated becomes R3. The four sides of the quadrangle may be further disposed with a rolling member 206 capable of rotating around the revolution center C. The rolling members 206 are rotated around the revolution center C, and a circle drawn to be rotated becomes R4. The R3 and R4 have the same revolution center C, but it will be fine that the distances from the revolution center C are different from each other. That is, when the rolling members 205 and 206 rotate so that the R3 and R4 becomes a concentric circle, the display apparatus 1 may be rotated from side to side (swiveled) around the revolution center C.

As in the first embodiment, the bottom of the stand 20 may be disposed with the ball 210 not having the directivity of rotation. The ball 210 is disposed in the bottom of the stand 20, thereby to more softly swivel the display apparatus 1. For example, when at least one ball 210 is disposed and at least one rolling members 206 capable of rotating around the revolution center C is disposed, the display apparatus 1 is rotated around the revolution center C to implement a swivel function.

The description about the type of the rolling members, and the mechanism for limiting the revolution amount of the rolling members, etc. may be applied similarly to the first embodiment.

Figure 6:
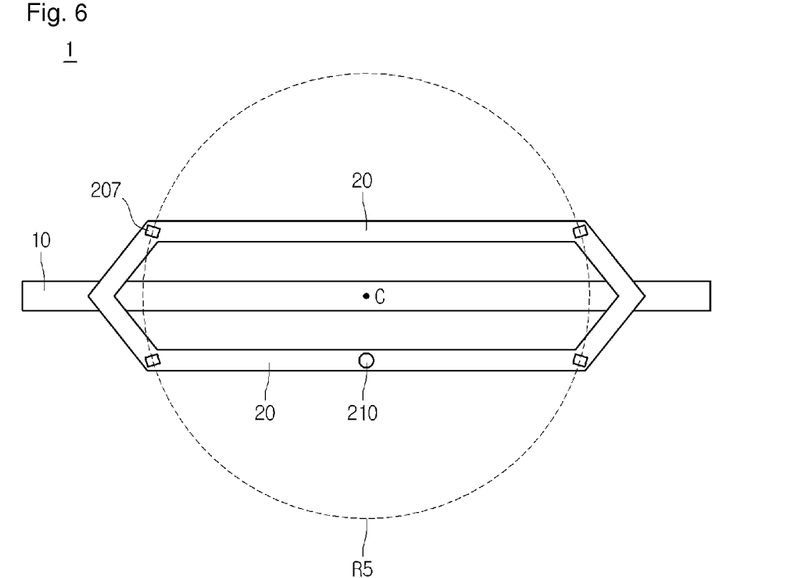
FIG. 6 is a view showing the bottom of the display apparatus according to a third embodiment of the present invention.

FIG. 6 is a view showing the bottom of the display apparatus according to a third embodiment of the present invention.

Referring to FIG. 6, the bottom of the stand 20 may be formed in the shape of a hexagon. In detail, the stand is U-shaped to be opened toward a top end thereof when seen from the front, and may become "◯"-shaped when seen from the side. Further, the section contacting the installing surface becomes a pair of lines to be extended side by side from side to side from the front and back of the display body 10. Further, the edges of the sections contacting the installing surface are mounted with each of the rolling members 207. The stand 20 may be fixed to the display apparatus 1.

In detail, the bottom of the stand 20 may be disposed with a plurality of rolling members 207 capable of rotating around the revolution center C. When the plurality of rolling members 207 rotate around the revolution center C, they rotate while drawing the same circle R5 from each other. They share the revolution center C only and may be also disposed in a position forming the concentric circle different from the radius of the circle drawn by the rolling members 207.

Further, the bottom of the stand 20 may be included with the ball 210 not having the directivity of rotation. When a plurality of balls 210 are disposed and at least one rolling members 207 capable of rotating around the revolution center C are disposed, the display apparatus 1 is rotated around the revolution center C to rotate (swivel) from side to side.

Figure 7:
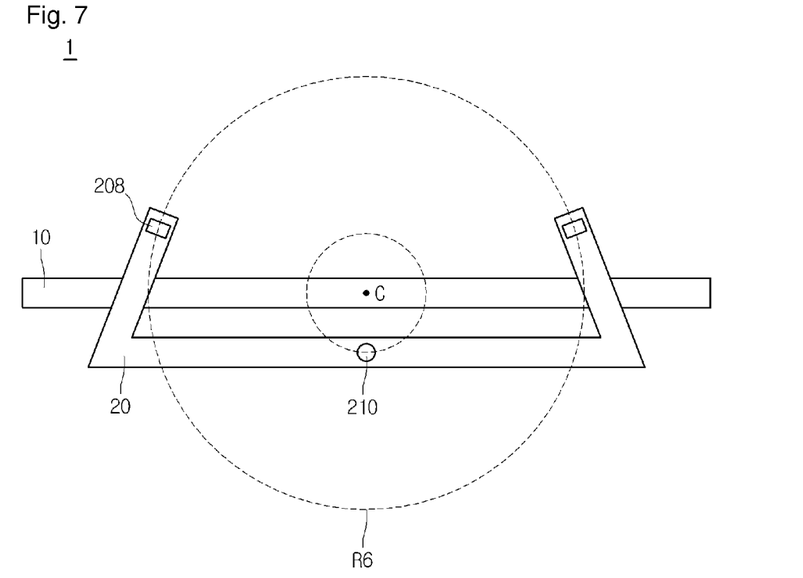
FIG. 7 is a view showing the bottom of the display apparatus according to a fourth embodiment of the present invention.

FIG. 7 is a view showing the bottom of the display apparatus according to a fourth embodiment of the present invention.

In FIG. 7, the stand 20 supporting the display apparatus 1 may be disposed as the line type having a non-standardized shape. The stand 20 may be fixed to the bottom end of the display apparatus 1. The bottom of the stand 20 may be disposed with at least one rolling members 208. When a plurality of rolling members 208 are disposed, the plurality of rolling members 208, as shown in FIG. 7, rotates around the revolution center C, thereby to draw the same circle R6 and to draw the concentric circles, having a different size, sharing the revolution center C.

The bottom of the stand 20 may be disposed with at least one ball 210 not having the directivity of rotation. The ball 210 is rotated around the revolution center C by the rolling members 208. The circle drawn by the ball 210 to be rotated may not be coincided with the circle drawn by the rolling members 208, but rotates around the same revolution center C as the rolling members 108. Therefore, the stand 20 may rotate around the revolution center C to swivel the display apparatus 1.

In the present embodiment, the left and right in the bottom back end of the stand 20 are mounted with each of the rolling members 208, and the center in the bottom front end of the stand 20 is mounted with the ball 210.

Figure 8:
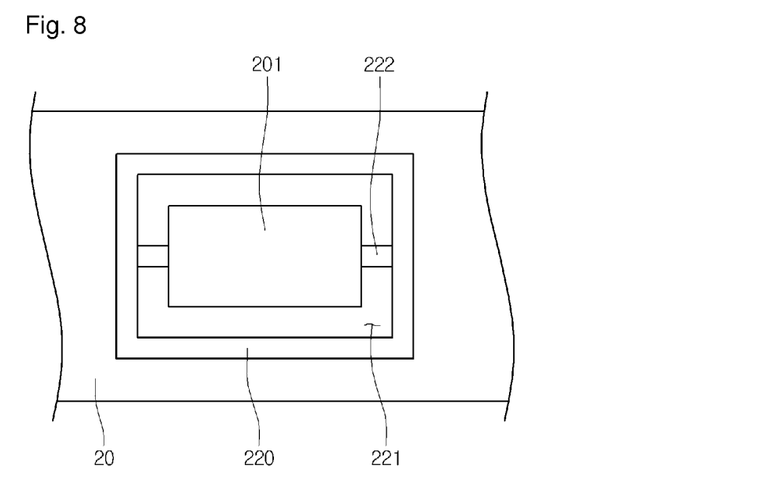
FIG. 8 is a view showing an embodiment for rolling members disposed in the display apparatus of the present invention.

FIG. 8 is a view showing an embodiment for the rolling members disposed in the display apparatus of the present invention.

Referring to FIG. 8, the bottom of the stand 20 is disposed with the groove 221 capable of mounting the rolling members 201, and the rolling members 201 may be inserted in a plurality of groove 221. The rolling members 201 may rotate around a bearing 222, that is, the center axis of the rotation, and the both ends of the bearing 222 are fixed to the inner wall of the groove 221. At this time, the section of the rolling members 201 to be exposed to the outside from the bottom of the stand 20 is positioned in the same plane as the bottom of the stand 20 or may be somewhat protruded from the bottom of the stand 20.

When the rolling members 201 are protruded from the bottom of the stand 20, the bottom part of the stand 20 may be formed with a protrusion portion 220 having the same length as a protrusion length of the rolling members 210. The display apparatus 1 may be supported by the rolling members 200 and the protrusion portion 220. The protrusion portion 220 may be formed along the circumference of the groove 221 mounted with the rolling members 201 to prevent the display apparatus 1 from dropping the sense of beauty by exposing the rolling members 201 to the outside. Therefore, after disposing the display apparatus 1, since the rolling member 201 is not exposed to the outside, it is possible to improve an appearance of a product, and since the rolling member 201 and the protrusion portion 220 support the display apparatus 1, it is advantageous to more stably dispose the display apparatus 1.

In the first to fourth embodiments, it is described that the stand 20 having the line type is disposed with the plurality of rolling members 200 so that the display apparatus 1 is swiveled, but types for the stand 200 disposed with the plurality of rolling members 200 are not limited to the description. For example, the bottom of a base portion in the stand including the existing neck portion and base portion may be disposed with the plurality of rolling members capable of rotating around the same revolution member.

Hereinafter, the mechanism for limiting the rotation amount of the display apparatus will be described in detail.

Figure 9:
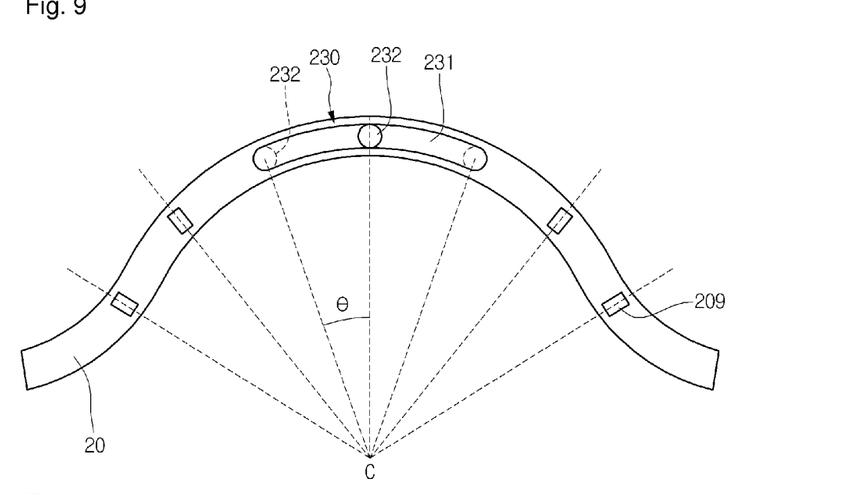
FIG. 9 is a view showing the bottom of the stand according to a fifth embodiment of the present invention.
Figure 10:
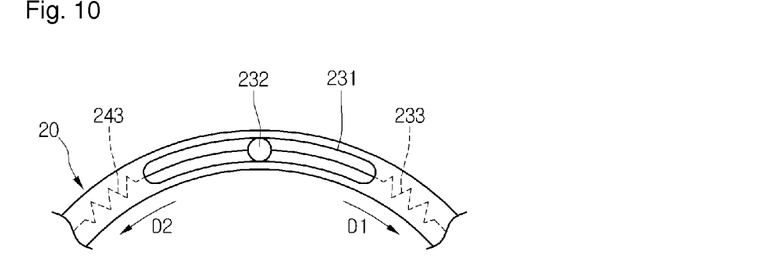
FIG. 10 is a view showing a part of a stand shown in FIG. 9.

FIG. 9 is a view showing the bottom of the stand according to a fifth embodiment of the present invention, and FIG. 10 is a view showing a part of a stand shown in FIG. 9.

Referring to FIGS. 9 and 10, the stand 20 includes a rail assembly 230 and rolling members 209 according to the fifth embodiment of the present invention. At least one rolling member 209 is disposed, thereby to rotate around the revolution center C.

The rail assembly 230 includes a rail 231 and a rotational limiting portion 232. Some bottom of the stand 20 is dented in a certain depth, and the rail 231 may be formed by an arc shape around the revolution center C. Therefore, the rail 231 is revolved around the revolution center C together with the rolling members 209. Further, even on moving the rail 231, the rotational limiting portion 232 does not move together with the rail 231 and may be disposed to allow a relative position only in the rail 231 to be verified. That is, when the display apparatus 1 is disposed in a specific place, the rotational limiting portion 232 is fixed to the installing surface disposed with the display apparatus 1. The bottom of the rotational limiting portion 232 is coated with rubber etc. such that the display apparatus 1 may be more stably seated in the bottom. Further, the rotational limiting portion 232 may be formed in a hemisphere shape so that it adheres to the installing surface thereof and the inner periphery of the rail.

As the rail 231 moves, the rotational limiting portion 232 may be interfered by both left and right ends of the rail 231. On swiveling the display apparatus 1, when the rolling members 209 and the rail 231 rotate in one direction at the certain angle around the revolution center C, the rotational limiting portion 232 is interfered by one end of the rail 231 to stop the swiveling of the display apparatus 1. The certain angle, that is, the maximum swivelling rotation angle θ of the display apparatus 1 may be determined by adjusting the length of the rail 231.

At this time, the rotational limiting portion 232 may be mounted with elastic members 233 and 243. one ends of the elastic members 233 and 243 are mounted in one sides of the stand 20, the other sides may be mounted in the rotational limiting portion 232. The elastic members 233 and 243 are mounted in both ends of the rail 231, or may be disposed in the inside of the stand 20 corresponding to the outside of the rail 231, respectively. The rotational limiting portion 232 receives force of restoration in both ends direction of the rail 231, that is, D1 and D2 directions by the elastic member 233 and 243. The elastic member for acting the force of restoration in the D1 direction may be defined as a first elastic member 233, and the elastic member for acting the force of restoration in the D2 direction may be defined as a second elastic member 243.

The first elastic member 233 and second elastic member 243 may be determined to allow the forces for acting on the rotational limiting portion 232 to become the same from each other. When the display apparatus 1 is disposed and is not swiveled, the forces of restoration of each of the elastic members 233 and 243 are acted as the same size in the opposition direction from each other such that the rotational limiting portion 232 may be positioned in the center of the rail 231.

Although the user allows the display apparatus 1 to be swiveled at the specific angle, the display apparatus 1 may be fixed by self weight of the display apparatus 1. Since the frictional force, between the rotational limiting portion 232 and the installing surface, generated by the self weight of the display apparatus 1 is larger than the force of restoration of the elastic member 233, the display body 10 does not rotate in any one direction by the force of restoration of the elastic members 233.

However, when the display apparatus 1 rotates at the certain angle, in case of lifting the display apparatus 1 to move the display apparatus 1 by the user, the force exerted into the rotational limiting portion 232 by the display apparatus 1 is released to remove the frictional force between the rotational limiting portion 232 and the installing surface. Therefore, the rotational limiting portion 232 may be positioned in the center of the rail 231 by the forces of restoration of the elastic members 233 and 243. Therefore, even on changing the position of the display apparatus 1, the maximum left and right swiveling angle for the display apparatus 1 may be maintained at it is.

Figure 11:
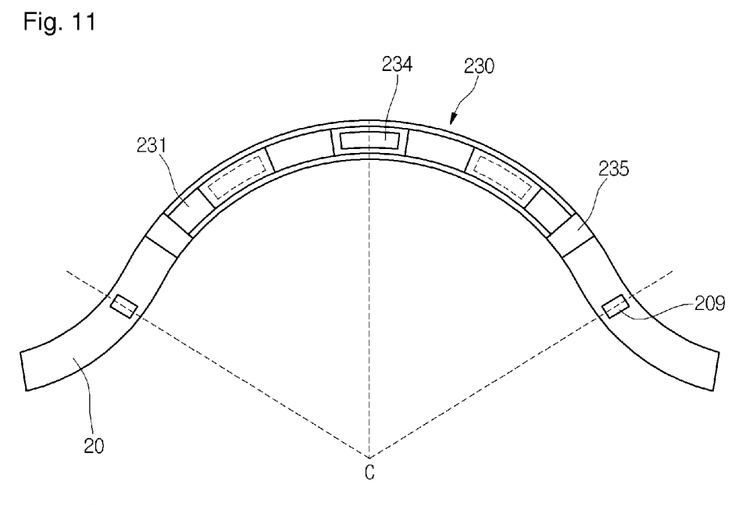
FIG. 11 is a view showing the bottom of the stand according to a sixth embodiment of the present invention.
Figure 12:
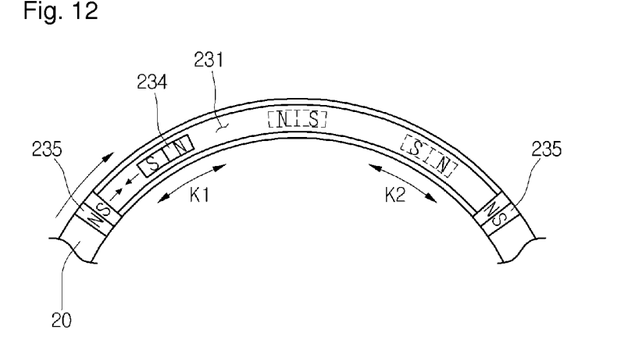
FIG. 12 is a view showing the part of the stand shown in FIG. 11.

FIG. 11 is a view showing the bottom of the stand according to a sixth embodiment of the present invention, and FIG. 12 is a view showing a part of a stand shown in FIG. 11.

Referring to FIGS. 11 and 12, a stand 20 includes a rail assembly 230 and rolling members 209. The rail assembly 230 includes a rail 231, a first magnet 234 and a second magnet 235.

The first magnet 234 is disposed to allow the display apparatus 1 disposed in the specific place to be fixed without moving. The first magnet 234 contacts the bottom to be installed with the display apparatus 1, and an outer periphery thereof is coated with rubber etc. to increase a contact force for the bottom, thereby to more stably dispose the display apparatus 1 in the bottom thereof.

Each of the second magnets 235 are fixed to both ends of the rail 231, and is disposed to rotate together with the rotation of the stand 20. The second magnets 235 may be disposed in one side of the stand 20.

The first magnet 234 and the second magnet 235 are disposed so that a repulsive force acts between them. That is, the first magnet 234 and the second magnet 235 are disposed to be faced with the same magnet pole from each other.

On swiveling the display apparatus 1 by the user, the second magnet 235 is moved in the direction of the first magnet 234, and the display apparatus 1 is rotated at the certain angle and then, is stopped by the repulsive force between the first magnet 234 and second magnet 235. Therefore, a rotation angle of the display apparatus 1 may be limited. Further, on lifting the display apparatus 1 to move the display apparatus 1, the first magnet 234 is positioned in the center of the rail 233, thereby to maintain the display apparatus 1 at the maximum swiveling angle.

Although the first magnet 234 and second magnet 235 use a permanent magnet as the material thereof, an electromagnet may be used to any one of the first magnet 234 and second magnet 235. Preferably, it is preferable that the second magnet 235 to be fixed in the stand 20 becomes the electromagnet. Therefore, the display apparatus 1 may be automatically swiveled by adjusting the direction and strength of the current supplied to the electromagnet, that is, the second magnet 235 to act attractive force or repulsive force on the first magnet 234.

Therefore, the display apparatus, that may swivel irrespective of the shape of the stand and may limit the rotation angle of the swivel, may be implemented.

The invention claimed is:

1. A display apparatus, comprising: a display body outputting an image signal; a stand supporting the display body and provided on an installing surface; and a swivel member provided in a bottom part of the stand and rotating the stand at a certain angle in a status where the stand is provided on the installing surface, wherein the swivel member includes a plurality of rotatable rollers mounted in the bottom part of the stand, and the plurality of rollers have the same revolution center, wherein the display apparatus further includes a frictional member coated on an outer periphery of the rollers, and wherein the frictional member includes rubber or silicon.

2. The display apparatus according to claim 1, wherein a rotation axis of each of the plurality of rollers coincides with any one of lines passing through the revolution center.

3. The display apparatus according to claim 1, wherein revolution radiuses of the plurality of rollers are the same or different from each other.

4. The display apparatus according to claim 3, wherein at least one of the plurality of rollers includes a spherical ball.

5. The display apparatus according to claim 1, wherein each of the plurality of rollers includes any one of a caster, a needle bearing and a pin bearing.

6. The display apparatus according to claim 1, wherein at least one of the plurality of rollers is controlled to rotate by a motor.

7. The display apparatus according to claim 1, farther including at least one spherical ball mounted in one side of a bottom of the stand and having the same revolution center as those of the plurality of rollers.

8. The display apparatus according to claim 7, wherein revolution radiuses of the plurality of rollers and the revolution radius of the spherical ball are the same or different from each other.

9. A display apparatus comprising:
a display body outputting an image signal;
a stand supporting the display body and provided on an installing surface; and
a swivel member provided in a bottom part of the stand and rotating the stand at a certain angle in a status where the stand is provided on the installing surface, wherein the swivel member includes a plurality of rotatable rollers mounted in the bottom part of the stand, and the plurality of rollers have the same revolution center;
a groove formed in a side surface of at least one of the plurality of rollers, and an interference portion fixed to the groove, wherein the interference portion includes:
a ball bearing accommodated in the inside of the stand; and
a spring allowing a part of the ball bearing to be inserted into the groove by pressurizing the ball bearing, wherein the groove and the interference portion limit a rotation amount of the display apparatus.

10. A display apparatus comprising:
a display body outputting an image signal;
a stand supporting the display body and provided on an installing surface; and
a swivel member provided in a bottom part of the stand and rotating the stand at a certain angle in a status where the stand is provided on the installing surface, wherein the swivel member includes a plurality of rotatable rollers mounted in the bottom part of the stand, and the plurality of rollers have the same revolution center;
an arc-shaped rail dented in the bottom of the stand and formed around the revolution center and
a rotational limiting portion accommodated in the rail and in contact with the installing surface by a weight of the display apparatus, wherein the arc-shaped rail and the rotational limiting portion limit a rotation amount of the display apparatus.

11. The display apparatus according to claim 10, further including a frictional member coated on the bottom part of the rotational limiting portion, wherein the frictional member contains rubber or silicon having a large frictional coefficient.

12. The display apparatus according to claim 10, further including a pair of elastic members of which a first end of each of the pair of elastic members is connected to the rotational limiting portion and a second end of each of the pair of elastic members is fixed to the stand, wherein the pair of elastic members is installed to allow restoration forces to act in opposition directions from each other with respect to the rotational limiting portion.

13. The display apparatus according to claim 10, wherein the rotational limiting portion includes a first magnet that generates magnetic force.

14. The display apparatus according to claim 13, further including a pair of second magnets fixed to both ends of the rail and generating repulsive forces against the first magnet.

15. The display apparatus according to claim 14, wherein any one of the first magnet and second magnet includes a permanent magnet, and the other one includes an electromagnet.

16. The display apparatus according to claim 15, wherein a rotation direction and rotation amount of the display apparatus are adjusted by controlling the direction and strength of the current supplied to the electromagnet.

* * * * *